(12) United States Patent
Grunthaner

(10) Patent No.: US 8,549,738 B2
(45) Date of Patent: Oct. 8, 2013

(54) FLEX CIRCUIT WITH SINGLE SIDED ROUTING AND DOUBLE SIDED ATTACH

(75) Inventor: Martin Paul Grunthaner, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/985,274

(22) Filed: Jan. 5, 2011

(65) Prior Publication Data

US 2011/0094670 A1    Apr. 28, 2011

Related U.S. Application Data

(62) Division of application No. 12/122,441, filed on May 16, 2008, now Pat. No. 8,456,851.

(51) Int. Cl.
*H05K 3/00* (2006.01)
*H05K 1/00* (2006.01)

(52) U.S. Cl.
USPC ............................................ 29/829; 174/254

(58) Field of Classification Search
USPC ............. 29/829; 174/254; 361/751, 750, 810, 361/749; 178/18.01–18.06; 349/150, 151, 349/158, 493
See application file for complete search history.

(56) References Cited

U.S. PATENT DOCUMENTS

| | | | | |
|---|---|---|---|---|
| 4,902,236 A | * | 2/1990 | Hasircoglu | 439/77 |
| 5,461,202 A | * | 10/1995 | Sera et al. | 174/254 |
| 5,483,261 A | * | 1/1996 | Yasutake | 345/173 |
| 5,488,204 A | * | 1/1996 | Mead et al. | 178/18.06 |
| 5,825,352 A | * | 10/1998 | Bisset et al. | 345/173 |
| 5,835,079 A | * | 11/1998 | Shieh | 345/173 |
| 5,880,411 A | * | 3/1999 | Gillespie et al. | 178/18.01 |
| 6,108,211 A | * | 8/2000 | Diessner | 361/751 |
| 6,188,391 B1 | * | 2/2001 | Seely et al. | 345/173 |
| 6,310,610 B1 | * | 10/2001 | Beaton et al. | 345/173 |
| 6,323,846 B1 | * | 11/2001 | Westerman et al. | 345/173 |
| 6,414,374 B2 | * | 7/2002 | Farnworth et al. | 257/620 |
| 6,690,387 B2 | * | 2/2004 | Zimmerman et al. | 345/684 |
| 7,015,894 B2 | * | 3/2006 | Morohoshi | 345/156 |
| 7,184,064 B2 | * | 2/2007 | Zimmerman et al. | 345/684 |
| 7,633,564 B2 | * | 12/2009 | Hong et al. | 349/12 |

(Continued)

FOREIGN PATENT DOCUMENTS

| | | |
|---|---|---|
| DE | 103 59 890 A1 | 7/2004 |
| EP | 1 469 393 A1 | 10/2004 |

(Continued)

OTHER PUBLICATIONS

Final Office Action mailed Sep. 15, 2011, for U.S. Appl. No. 12/122,441, filed May 16, 2008, 11 pages.

(Continued)

*Primary Examiner* — David Angwin
(74) *Attorney, Agent, or Firm* — Morrison & Foerster LLP

(57) ABSTRACT

A method for providing electrical connections to both sides of a touch sensor panel is disclosed. The method comprises forming conductive traces on a first surface of a base film, shaping the base film to form first and second attachment areas that include the conductive traces, forming a conductive shield over the conductive traces, wherein the shield is electrically coupled to one or more of the conductive traces, and folding the base film such that the conductive traces on the first and second attachment areas are positioned and aligned for attachment to pads on first and second sides of the touch sensor panel.

12 Claims, 7 Drawing Sheets

(56) References Cited

U.S. PATENT DOCUMENTS

| | | | |
|---|---|---|---|
| 7,663,607 B2* | 2/2010 | Hotelling et al. | 345/173 |
| 2002/0079512 A1* | 6/2002 | Yamazaki et al. | 257/200 |
| 2002/0098612 A1* | 7/2002 | Ahn et al. | 438/51 |
| 2002/0189862 A1* | 12/2002 | Miyake et al. | 174/262 |
| 2003/0222660 A1* | 12/2003 | Morimoto | 324/661 |
| 2004/0041796 A1* | 3/2004 | Lee | 345/173 |
| 2004/0256147 A1* | 12/2004 | Shigetaka | 174/254 |
| 2004/0264149 A1* | 12/2004 | Carswell | 361/752 |
| 2005/0219230 A1* | 10/2005 | Nakayama et al. | 345/173 |
| 2005/0270272 A1* | 12/2005 | Shi | 345/173 |
| 2006/0026521 A1* | 2/2006 | Hotelling et al. | 715/702 |
| 2006/0197753 A1* | 9/2006 | Hotelling | 345/173 |
| 2008/0158181 A1* | 7/2008 | Hamblin et al. | 345/173 |
| 2008/0158183 A1* | 7/2008 | Hotelling et al. | 345/173 |
| 2008/0202807 A1* | 8/2008 | Wesselman et al. | 174/388 |
| 2009/0283300 A1* | 11/2009 | Grunthaner | 174/254 |

FOREIGN PATENT DOCUMENTS

| | | |
|---|---|---|
| JP | 4-015257 U | 2/1992 |
| JP | 11-121892 A | 4/1999 |
| JP | 2000/163031 A | 6/2000 |
| JP | 2002/342033 A | 11/2002 |
| JP | 2003-108302 A | 4/2003 |
| JP | 2003-110207 A | 4/2003 |
| JP | 2004-247352 A | 9/2004 |
| JP | 2008-052874 A | 3/2008 |
| WO | WO-2007/146780 A2 | 12/2007 |
| WO | WO-2007/146780 A3 | 12/2007 |
| WO | WO-2009/140258 A1 | 11/2009 |

OTHER PUBLICATIONS

Non-Final Office Action mailed Jan. 12, 2011, for U.S. Appl. No. 12/122,441, filed May 16, 2008, 10 pages.

Non-Final Office Action mailed Mar. 1, 2012, for U.S. Appl. No. 12/122,441, filed May 16, 2008, 11 pages.

Non-Final Office Action mailed Jun. 10, 2011. for U.S. Appl. No. 12/122,441, filed May 16, 2008, 11 pages.

International Search Report mailed Aug. 21, 2009, for PCT Application No. PCT/US2009/043592, three pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Final Office Action mailed Sep. 13, 2012, for U.S. Appl. No. 12/122,441, filed May 16, 2008, 15 pages.

Notice of Allowance mailed Feb. 5, 2013, for U.S. Appl. No. 12/122,441, filed May 16, 2008, eight pages.

* cited by examiner

FLEX CIRCUIT WITH SINGLE SIDED ROUTING AND DOUBLE SIDED ATTACH

CROSS-REFERENCE TO RELATED APPLICATIONS

This application is a divisional of U.S. patent application Ser. No. 12/122,441, filed May 16, 2008, the entire disclosure of which is incorporated herein by reference.

FIELD OF THE INVENTION

This relates generally to touch sensor panels, and more particularly, to cost-effective flex circuit designs capable of being attached to both sides of a touch sensor panel.

BACKGROUND OF THE INVENTION

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

Mutual capacitance touch sensor panels can be formed from a matrix of drive and sense lines of a substantially transparent conductive material such as Indium Tim Oxide (ITO), sometimes arranged in rows and columns in horizontal and vertical directions on a substantially transparent substrate. In some touch sensor panel designs, ITO drive and sense lines can be formed on opposite sides of the same substrate in a configuration referred to herein as double-sided ITO (DITO). The substantially transparent drive and sense lines can be routed to one edge of the substrate for off-board connections using conductive (e.g. metal) traces in the border areas of the substrate where transparency is not required. However, it can be expensive to manufacture the one or more flex circuits that are required to provide off-board connectivity for the drive and sense lines.

SUMMARY OF THE INVENTION

This relates to a flex circuit having conductive traces formed on only one side of a base film for attaching to both sides of a DITO touch sensor panel. By having conductive traces formed on only one side of the base film, the number of process steps and fabrication cost can be reduced because only a single etching step is needed. Furthermore, because the flex circuit is thinner, the resultant space savings can be utilized for other features in a device without enlarging the overall device package.

The flex circuit can be formed from a base film and can be bonded to both the top and bottom sides of the touch sensor panel at one end of the touch sensor panel. The flex circuit can include conductive traces (e.g. copper) and an insulator formed only on the side of the flex circuit that faces the touch sensor panel when bonded to the touch sensor panel. The flex circuit can be formed with a bend so that it can be attached to pads formed on either side of the touch sensor panel. A tail, which can be integrally formed with the flex circuit, can extend away from the touch sensor panel and can contain tail conductors for attaching to a main logic board.

The flex circuit can include a first attachment area that can include active conductors and dummy conductors formed along its length for making electrical connections with pads on a top surface of the touch sensor panel. The flex circuit can also include a second attachment area that can include lower conductors formed at its distal ends for making electrical connections with pads on a bottom surface of the touch sensor panel. In some embodiments, lower conductors on the second attachment area are arranged in conjunction with active and dummy conductors on the first attachment area so that when the flex circuit is folded and bonded to the touch sensor panel, the lower conductors on the bottom surface of the touch sensor panel and the active and dummy conductors on the top surface are not on directly opposing sides of the touch sensor panel. This arrangement can minimize unwanted coupling of signals between the conductors.

All traces and conductors on the flex circuit can be formed on the same side of the flex circuit. Because the traces and conductors are formed on the same side of the flex circuit, no vias and plating are required, and a thinner flex circuit can be manufactured. As a result, a bend can be formed in the flex circuit with the very small radius required by the thinness of the touch sensor panel. The thinness of the flex circuit can have other advantages such as providing more room in the z-direction for other electronics and/or mechanical structures, or allowing for thinner overall devices. In addition, forming only a single layer of conductors and traces can reduce the number of process steps required (because only a single etching step is needed), which can reduce manufacturing costs.

In the first attachment area, a particular number of dummy conductors can be formed between the active conductors. The number of dummy conductors, and the spacing between the dummy conductors and the active conductors, can be chosen (e.g., empirically) in accordance with the type and thickness of the flex circuit and the cross-sectional dimensions of the conductors. By the proper selection of conductor spacing, enough space can remain between the conductors (dummy and active) to retain most of the ACF underneath the first attachment area, minimizing the amount of ACF that is squeezed out.

The second attachment area can include a base film (e.g. polyamide), upon which a conductive trace layer (e.g. plated copper) and an insulator (a.k.a. coverlay or cover film) can be formed. A stiffener, which also acts as a spacer, can be attached at the distal end of the second attachment area to ensure that sufficient bonding pressure is achieved at the distal end.

To provide enhanced shielding for the single-sided flex circuits, thin conductive films can be attached to both sides of the flex circuits. The flex circuit can include a base film upon which a layer of conductive traces (e.g. copper) and an insulator can be formed. One or more conductive traces can be held at a fixed potential (e.g. ground). In one embodiment, a first opening (or notch) in the insulator can be formed over a particular conductive trace that is held at a fixed potential such as ground. Conductive film can then be applied over the insulator, where it can conform to the shape of the opening and make electrical contact with one or more of the fixed potential traces to hold the conductive film at the fixed potential. When the conductive film is held at the fixed potential, it can serve as a shield for the conductive traces.

In another embodiment, before any conductive film is applied, a second opening (or notch) can also be formed through the base film and the insulator, while avoiding any conductive traces. Conductive film can then be applied over the insulator, where it can conform to the shape of the opening (or notch) and make electrical contact with one or more of the fixed potential traces to hold the conductive film at the fixed potential. Conductive film can then be applied over the base film, where it can conform to the hole and make electrical contact with the conductive film on the opposite side. In this manner, the conductive film on both sides of the flex circuit can be held at a fixed potential and serve as shields.

DETAILED DESCRIPTION OF THE PREFERRED EMBODIMENTS

In the following description of preferred embodiments, reference is made to the accompanying drawings which form a part hereof, and in which it is shown by way of illustration specific embodiments in which the invention can be practiced. It is to be understood that other embodiments can be used and structural changes can be made without departing from the scope of the embodiments of this invention.

This relates to a flex circuit having conductive traces formed on only one side of a base film for attaching to both sides of a DITO touch sensor panel. By having conductive traces formed on only one side of the base film, the number of process steps and fabrication cost can be reduced because only a single etching step is needed. Furthermore, because the flex circuit is thinner, the resultant space savings can be utilized for other features in a device without enlarging the overall device package.

Although embodiments of the invention may be described and illustrated herein in terms of DITO touch sensor panels, it should be understood that embodiments of the invention are also applicable to other touch sensor panel configurations, such as configurations in which the drive and sense lines are formed on different substrates or on the back of a cover glass, and configurations in which the drive and sense lines are formed on the same side of a single substrate.

Figure 1A:
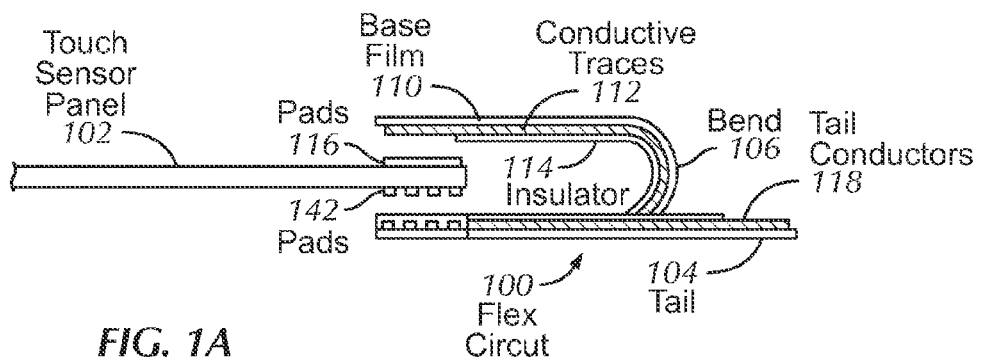
FIG. 1a illustrates a side view of an exemplary flex circuit 100 according to embodiments of the invention.

FIG. 1a illustrates a side view of an exemplary flex circuit 100 according to embodiments of the invention. Note that FIG. 1a is not to scale, and has exaggerated dimensions, particularly in the z-direction, for purposes of illustration only. In the example of FIG. 1a, flex circuit 100 can be formed from base film 110 and can be bonded to both the top and bottom sides at one end of touch sensor panel 102. Flex circuit 100 can include conductive traces 112 (e.g. copper) and insulator 114 formed only on the side of the flex circuit that faces touch sensor panel 102 when bonded to the touch sensor panel. In the exemplary embodiment of FIG. 1a, flex circuit 100 can be formed with bend 106 so that it can be attached to pads 116 and 142 formed on either side of touch sensor panel 102. Tail 104, which can be integrally formed with flex circuit 100, can extend away from touch sensor panel 102 and can contain tail conductors 118 for attaching to a main logic board.

Figure 1B:
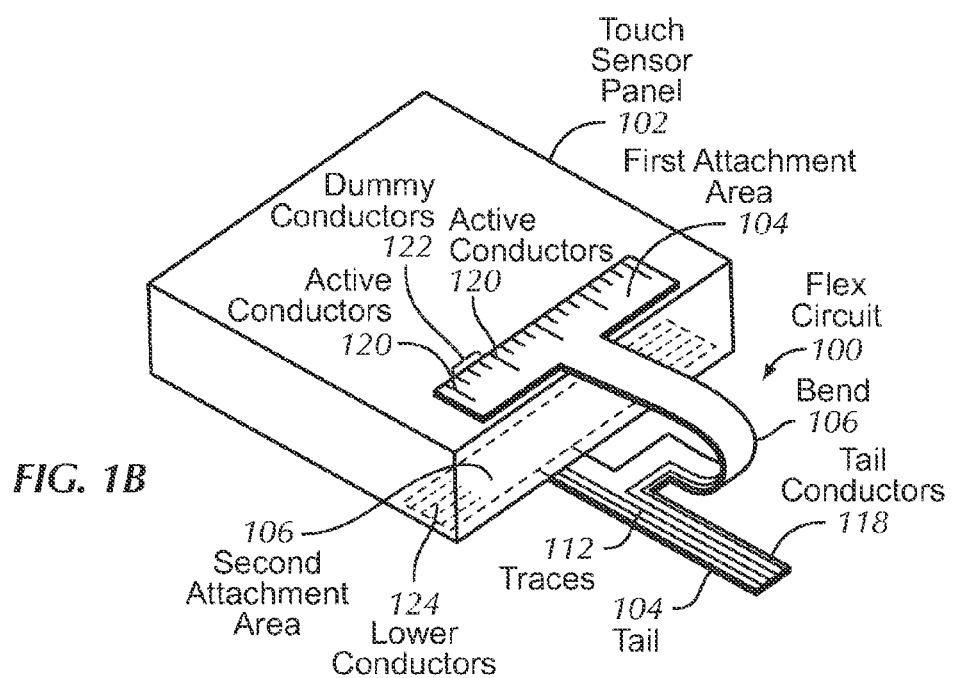
FIG. 1b illustrates a perspective view of the exemplary flex circuit of FIG. 1a according to embodiments of the invention.

FIG. 1b illustrates a perspective view of the exemplary flex circuit of FIG. 1a according to embodiments of the invention. Note that FIG. 1b is also not to scale, and has exaggerated dimensions, particularly in the z-direction, for purposes of illustration only. In the example of FIG. 1b, flex circuit 100 can include first attachment area 104 that can include active conductors 120 and dummy conductors 122 formed along its length for making electrical connections with pads on a top surface of touch sensor panel 102. Flex circuit 100 also includes second attachment area 106 that can include lower conductors 124 formed at its distal ends for making electrical connections with pads on a bottom surface of touch sensor panel 102. In some embodiments, lower conductors 124 on second attachment area 106 are arranged in conjunction with active and dummy conductors 120 and 122 on first attachment area 104 so that when flex circuit 100 is folded and bonded to touch sensor panel 102, the lower conductors on the bottom surface of the touch sensor panel and the active and dummy conductors on the top surface are not on directly opposing sides of the touch sensor panel. This arrangement can minimize unwanted coupling of signals between the conductors.

All traces 112 and conductors 118, 120, 122 and 124 on flex circuit 100 can be formed on the same side of the flex circuit according to embodiments of the invention. Although FIGS. 1a and 1b illustrate bend 106 having an exaggerated radius for purposes of illustration only, in practice the bend can be required to have a very small radius given the thinness of touch sensor panel 100. Because the traces and conductors are formed on the same side of flex circuit 100, no vias and plating are required, and a thinner flex circuit can be manufactured. As a result, bend 106 can be formed with the very small radius required by the thinness of touch sensor panel 100. In contrast, conventional flex circuits having traces on both sides require vias through the base film and plating to establish an electrical connection through the via. Because of the dual traces and plating, conventional flex circuits are generally stiffer and cannot form bends with very small radii.

The thinness of the flex circuit achieved according to embodiments of the invention can have other advantages such as providing more room in the z-direction for other electronics and/or mechanical structures, or allowing for thinner overall devices. In addition, forming only a single layer of conductors and traces can reduce the number of process steps required (because only a single etching step is needed), which can reduce manufacturing costs.

Figure 1C:
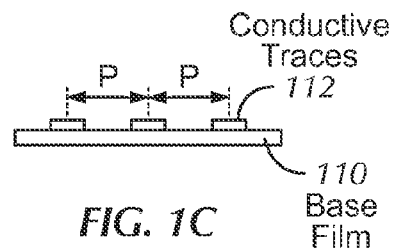
FIG. 1c illustrates a side view of conductive traces formed on one side of a flex circuit base film according to embodiments of the invention.

FIG. 1c illustrates a side view of conductive traces 112 formed on one side of base film 110 according to embodiments of the invention. As mentioned above, in conventional flex circuits with traces on both sides of a base film, vias are needed to make connections between layers, and therefore plating is needed to provide conductivity through the vias. However, when plating is applied over traces 112, the traces become thicker, necessitating wider spacing between traces to ensure that shorts between traces do not occur. Because single-sided embodiments of the invention do not require plating, a finer pitch (P) between traces can be achieved, which can result in smaller flex circuits.

Figure 2A:
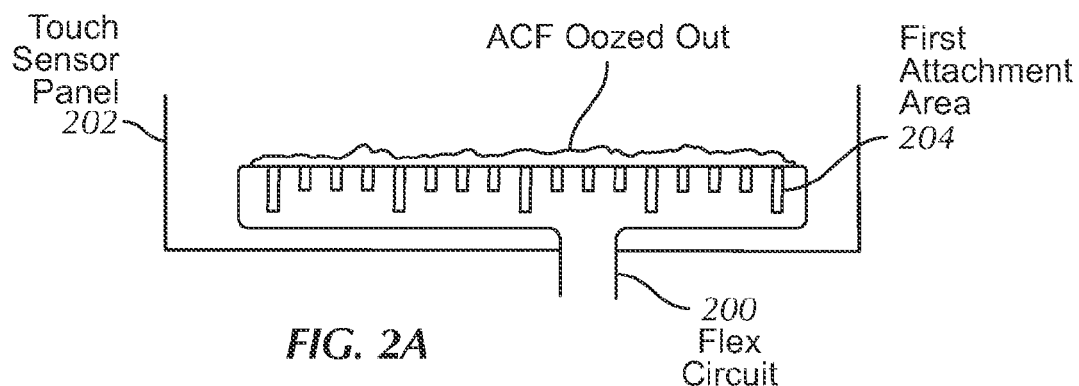
FIG. 2a illustrates a top view of an exemplary first attachment area on the flex circuit of FIG. 1b according to embodiments of the invention.

FIG. 2a illustrates a top view of an exemplary first attachment area on the flex circuit of FIG. 1b according to embodiments of the invention. In the example of FIG. 2a, first attachment area 204 can be bonded down to touch sensor panel 202 with anisotropic conductive film (ACF), which can form a conductive bond between the conductors on the first attachment area and the pads on the touch sensor panel. Because pressure is used to bond first attachment area 204 to touch sensor panel 202, some ACF can be squeezed out during bonding, as shown at 226. In touch screen embodiments, where optical clarity of touch sensor panel 202 is important, it is desirable to minimize the amount of ACF that gets squeezed out during bonding so that it does not intrude into the substantially transparent areas of the touch sensor panel.

Figure 2B:
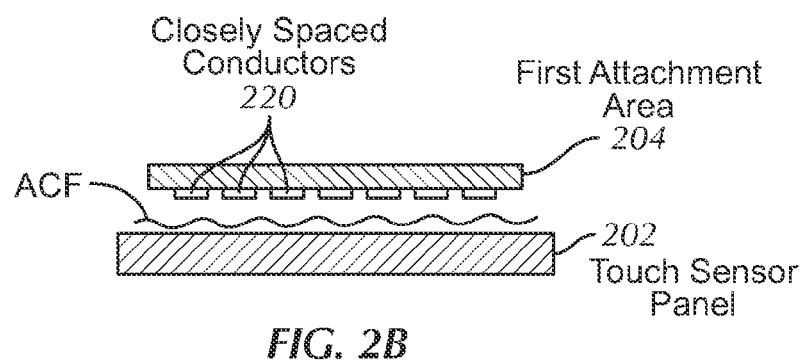
FIG. 2b illustrates a side view of an exemplary first attachment area on a flex circuit having a first conductor configuration.

FIG. 2b illustrates a side view of exemplary first attachment area 204 on flex circuit 200 having a first conductor configuration. In the example of FIG. 2b, if active conductors 220 are spaced too closely together, there can be insufficient spaces between conductors to contain ACF 226, and as a result, an excessive amount of the ACF can be squeezed out into the substantially transparent areas of the touch sensor panel.

Figure 2C:
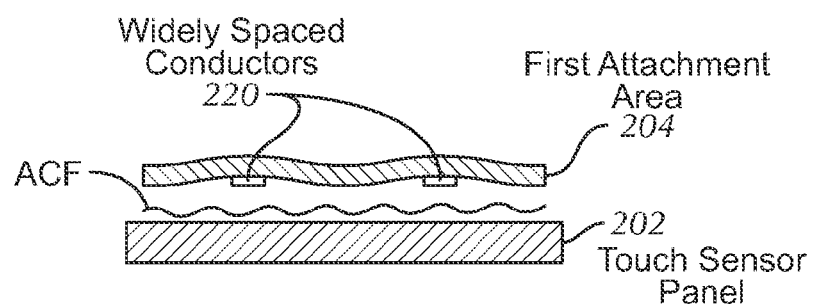
FIG. 2c illustrates a side view of an exemplary first attachment area on a flex circuit having a second conductor configuration.

FIG. 2c illustrates a side view of exemplary first attachment area 204 on flex circuit 200 having a second conductor configuration. In the example of FIG. 2c, if active conductors 220 are spaced too far apart, first attachment area 204 (which can be formed from flexible base film) can be pressed down and fill in much of the spaces between the conductors, and again there can be insufficient spaces between conductors to contain ACF 226. As a result, an excessive amount of the ACF can once again be squeezed out into the substantially transparent areas of the touch sensor panel.

Figure 2D:
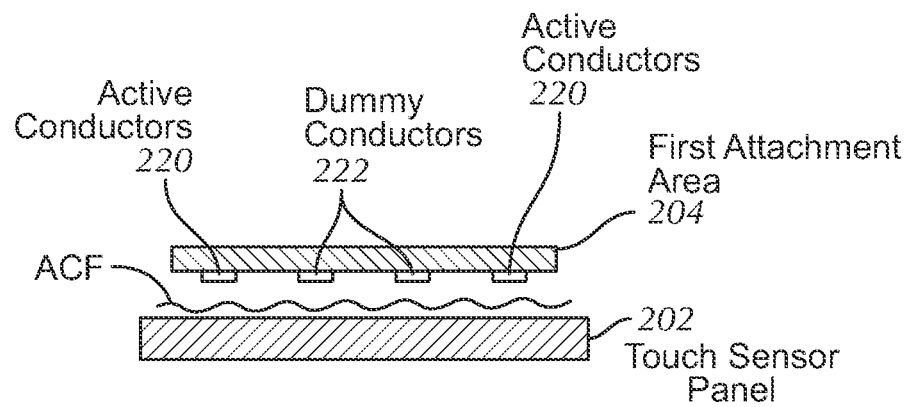
FIG. 2d illustrates a side view of an exemplary first attachment area on a flex circuit having a third conductor configuration according to embodiments of the invention.

FIG. 2d illustrates a side view of exemplary first attachment area 204 on flex circuit 200 having a third conductor configuration according to embodiments of the invention. In the example of FIG. 2d, a particular number of dummy conductors 222 can be formed between active conductors 220. The number of dummy conductors 222, and the spacing between the dummy conductors and active conductors 220, can be chosen (e.g., empirically) in accordance with the type and thickness of flex circuit 200 and the cross-sectional dimensions of the conductors. By the proper selection of conductor spacing, enough space can remain between the conductors (dummy and active) to retain most of the ACF underneath first attachment area 204, minimizing the amount of ACF that is squeezed out.

Figure 3:
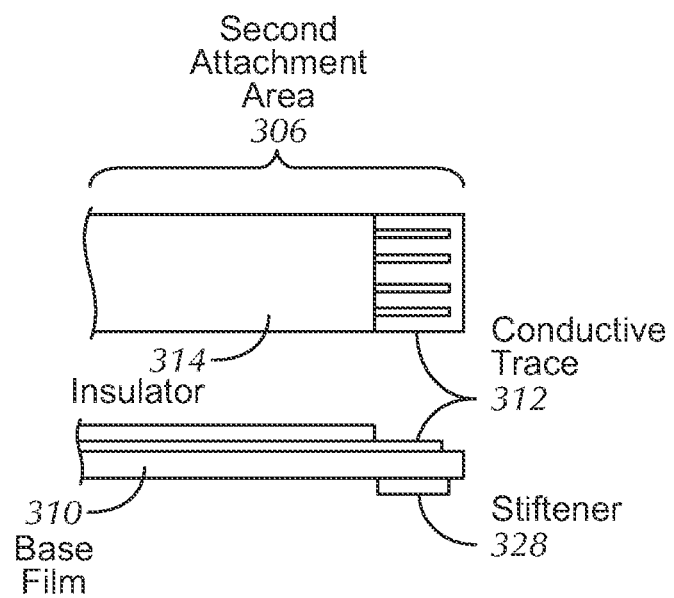
FIG. 3 illustrates a top and side view of a distal end of an exemplary second attachment area as shown in FIG. 1b according to embodiments of the invention.

FIG. 3 illustrates a top and side view of a distal end of an exemplary second attachment area as shown in FIG. 1b according to embodiments of the invention. In the example of FIG. 3, second attachment area 306 can include base film 310 (e.g. polyamide), upon which conductive trace layer 312 (e.g. plated copper) and insulator 314 (a.k.a. coverlay or cover film) can be formed. Stiffener 328, which also acts as a spacer, can be attached at the distal end of second attachment area 306 to ensure that sufficient bonding pressure is achieved at the distal end.

As mentioned above, conventional flex circuits having traces on both sides require vias formed in the base film and plating to establish an electrical connection through the via. Insulators are also required on both sides of the flex circuit to protect the conductive traces formed thereon. Because of the dual plated traces and dual insulators, and the overall increased thickness of conventional flex circuits, conventional dual-sided flex circuits provide shielding for the conductive traces. To provide enhanced shielding for single-sided flex circuits according to embodiments of the invention, thin conductive films can be attached to both sides of the flex circuits.

Figure 4A:
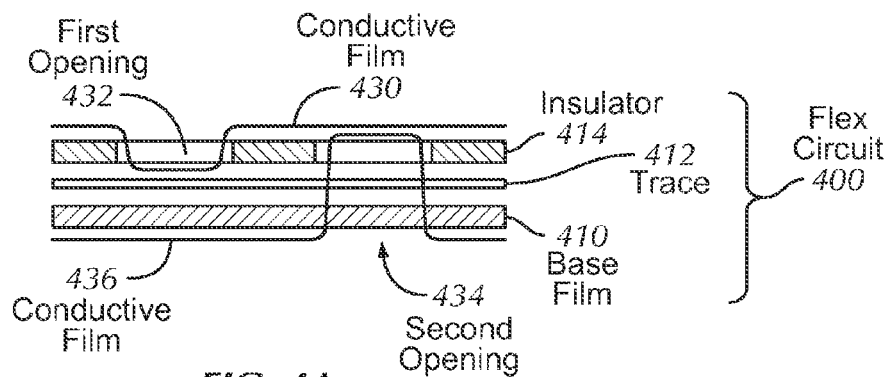
FIG. 4a illustrates a side view of an exemplary flex circuit including conductive film on the top side and optionally the bottom side according to embodiments of the invention.

FIG. 4a illustrates a side view of an exemplary flex circuit 400 including conductive film 430 on the top side and optionally the bottom side 436 according to embodiments of the invention. Note that FIG. 4a is not to scale, and has exaggerated dimensions for purposes of illustration only. In the example of FIG. 4a, flex circuit 400 can include base film 410, upon which a layer of conductive traces 412 (e.g. copper) and an insulator 414 can be formed. One or more of conductive traces 412 can be held at a fixed potential (e.g. ground). In one embodiment, first opening (or notch) 432 in insulator 414 can be formed over a particular conductive trace that is held at a fixed potential such as ground. Conductive film 430 can then be applied over insulator 414, where it can conform to the shape of opening 432 and make electrical contact with one or more of the fixed potential traces to hold the conductive film at the fixed potential. When conductive film 430 is held at the fixed potential, it can serve as a shield for conductive traces 412.

In another embodiment, before any conductive film is applied, second opening (or notch) 434 can also be formed through base film 410 and insulator 414, while avoiding any conductive trace 412. Conductive film 430 can then be applied over insulator 414, where it can conform to the shape of opening (or notch) 434 and make electrical contact with one or more of the fixed potential traces to hold the conductive film at the fixed potential. Conductive film 436 can then be applied over base film 410, where it can conform to hole 434 and make electrical contact with conductive film 414 on the opposite side. In this manner, the conductive film on both sides of the flex circuit can be held at a fixed potential and serve as shields.

Figure 4B:
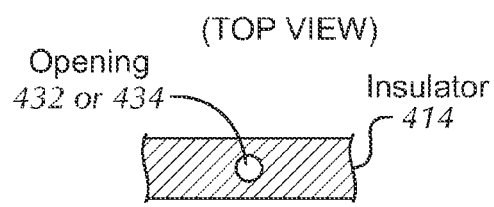
FIG. 4b illustrates a top view of an exemplary flex circuit with a hole in an insulator for holding at least one conductive film at a fixed potential according to embodiments of the invention.

FIG. 4b illustrates a top view of exemplary flex circuit 400 with opening 432 or 434 in at least insulator 414 for holding at least one conductive film at a fixed potential according to embodiments of the invention.

Figure 4C:
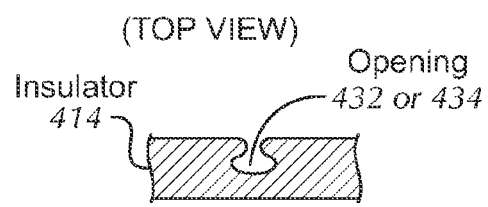
FIG. 4c illustrates a top view of an exemplary flex circuit with a notch in an insulator for holding at least one conductive film at a fixed potential according to embodiments of the invention.

FIG. 4c illustrates a top view of exemplary flex circuit 400 with notch 432 or 434 in at least insulator 414 for holding at least one conductive film at a fixed potential according to embodiments of the invention.

Figure 4D:
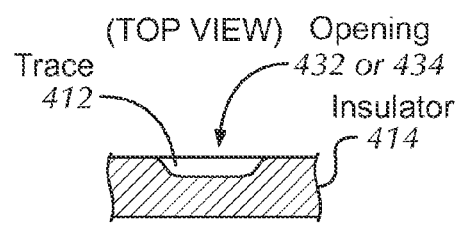
FIG. 4d illustrates a top view of an exemplary flex circuit with a different notch in an insulator for holding at least one conductive film at a fixed potential according to embodiments of the invention.

FIG. 4d illustrates a top view of exemplary flex circuit 400 with a different notch 432 or 434 in at least insulator 414 for holding at least one conductive film at a fixed potential according to embodiments of the invention.

Figure 4E:
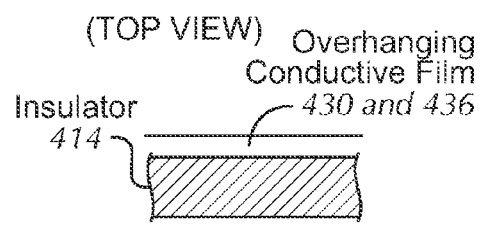
FIG. 4e illustrates a top view of an exemplary flex circuit with no notch, but with conductive films extending a beyond base film and connected together for holding both conductive films at a fixed potential according to embodiments of the invention.

FIG. 4e illustrates a top view of exemplary flex circuit 400 with no notch. In the embodiment of FIG. 4e, conductive films 430 and 436 extend beyond (overhang) base film 414 and are conductively bonded in the overhanging area for holding both conductive films at a fixed potential according to embodiments of the invention.

Figure 5A:
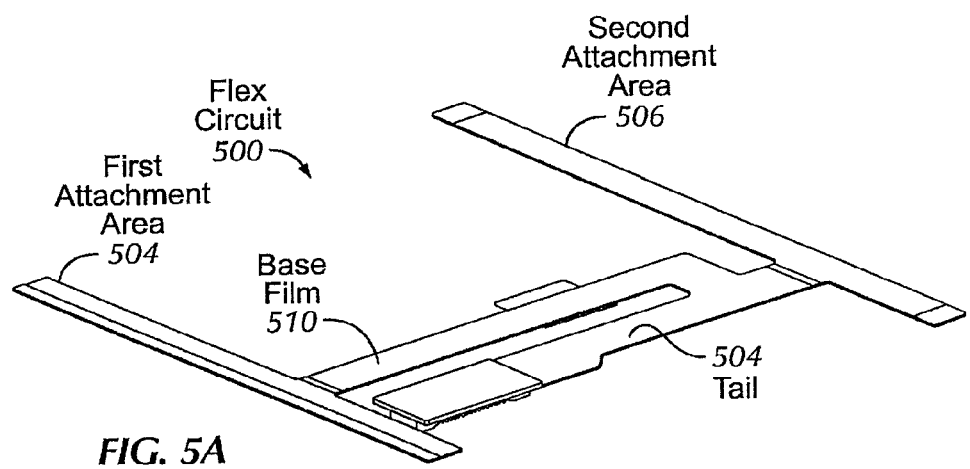
FIGS. 5a and 5b illustrate perspective views of an exemplary flex circuit in its original flattened fabrication configuration according to embodiments of the invention.
Figure 5B:
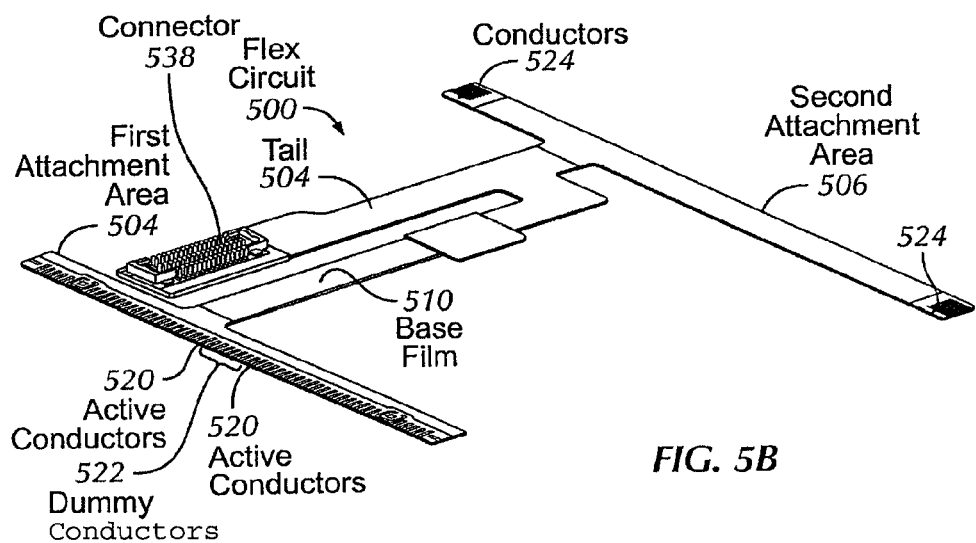

FIGS. 5a and 5b illustrate perspective views of exemplary flex circuit 500 in its original flattened fabrication configuration according to embodiments of the invention. In the example of FIGS. 5a and 5b, flex circuit 500 includes first attachment area 504 that include active conductors 520 and dummy conductors 522 formed along its length. Flex circuit 500 also includes second attachment area 506 that can include conductors 524 formed at its distal ends. In the example of FIGS. 5a and 5b, flex circuit 500 is formed from base film 510, and includes conductive traces and an insulator (not shown) formed only on the side of the base film visible in FIG. 5b. Tail 504, which is integrally formed as part of flex circuit 500, contain tail conductors for connecting to connector 538.

Figure 6:
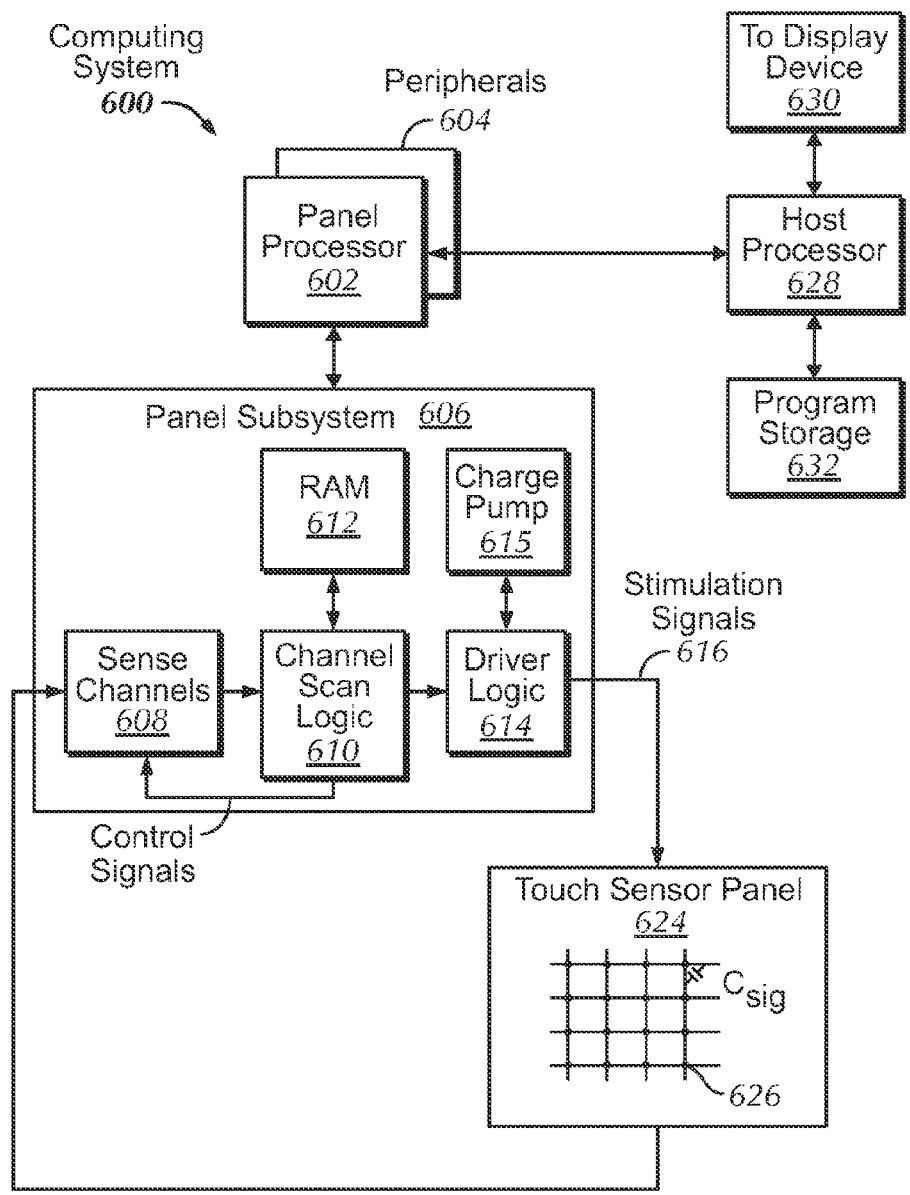
FIG. 6 illustrates an exemplary computing system including a touch sensor panel connected to a panel subsystem using the flex circuit according to embodiments of the invention

FIG. 6 illustrates exemplary computing system 600 that can include one or more of the embodiments of the invention described above. Computing system 600 can include one or more panel processors 602 and peripherals 604, and panel subsystem 606. Peripherals 604 can include, but are not limited to, random access memory (RAM) or other types of memory or storage, watchdog timers and the like. Panel subsystem 606 can include, but is not limited to, one or more sense channels 608, channel scan logic 610 and driver logic 614. Channel scan logic 610 can access RAM 612, autonomously read data from the sense channels and provide control for the sense channels. In addition, channel scan logic 610 can control driver logic 614 to generate stimulation signals 616 at various frequencies and phases that can be selectively applied to drive lines of touch sensor panel 624. In some embodiments, panel subsystem 606, panel processor 602 and peripherals 604 can be integrated into a single application specific integrated circuit (ASIC).

Touch sensor panel 624 can include a capacitive sensing medium having a plurality of drive lines and a plurality of sense lines, although other sensing media can also be used. Each intersection of drive and sense lines can represent a capacitive sensing node and can be viewed as picture element (pixel) 626, which can be particularly useful when touch sensor panel 624 is viewed as capturing an "image" of touch. (In other words, after panel subsystem 606 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) Each sense line of touch sensor panel 624 can drive sense channel 608 (also referred to herein as an event detection and demodulation circuit) in panel subsystem 606. Touch sensor panel 624 can be connected to panel subsystem 606, panel processor 602 and peripherals 604 through the flex circuit according to embodiments of the invention.

Computing system 600 can also include host processor 628 for receiving outputs from panel processor 602 and performing actions based on the outputs that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 628 can also perform additional functions that may not be related to panel processing, and can be connected to program storage 632 and display device 630 such as an LCD display for providing a UI to a user of the device. Display device 630 together with touch sensor panel 624, when located partially or entirely under the touch sensor panel, can form touch screen 618.

Note that one or more of the functions described above can be performed by firmware stored in memory (e.g. one of the peripherals 604 in FIG. 6) and executed by panel processor 602, or stored in program storage 632 and executed by host processor 628. The firmware can also be stored and/or transported within any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any medium that can contain or store the program for use by or in connection with the instruction execution system, apparatus, or device. The computer readable medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Figure 7A:
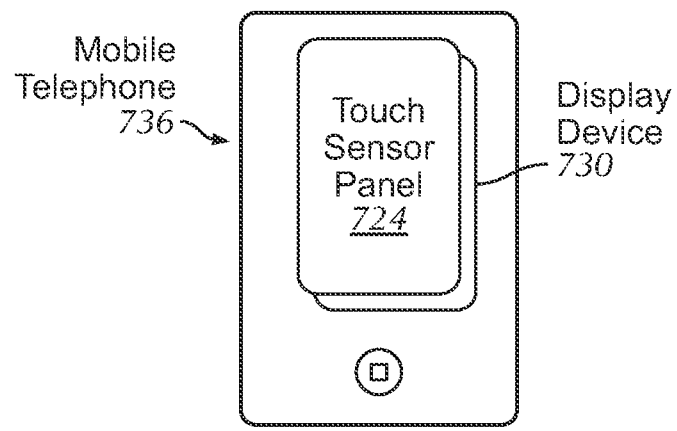
FIG. 7a illustrates an exemplary mobile telephone having a touch sensor panel connected to a panel subsystem using the flex circuit according to embodiments of the invention.

FIG. 7a illustrates exemplary mobile telephone 736 that can include touch sensor panel 724 and display device 730, the touch sensor panel connected to a panel subsystem using the flex circuit according to embodiments of the invention.

Figure 7B:
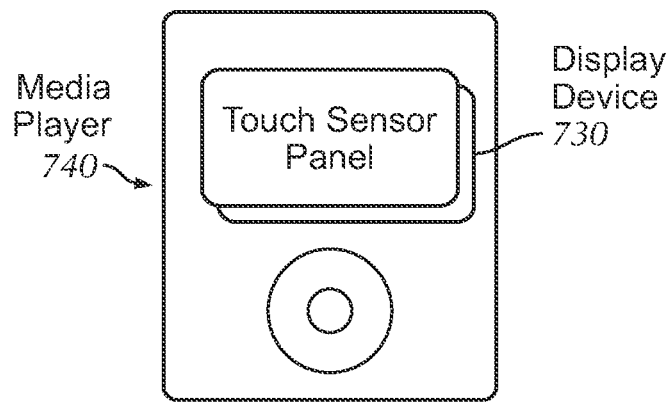
FIG. 7b illustrates an exemplary digital media player having a touch sensor panel connected to a panel subsystem using the flex circuit according to embodiments of the invention.

FIG. 7b illustrates exemplary digital media player 740 that can include touch sensor panel 724 and display device 730, the touch sensor panel connected to a panel subsystem using the flex circuit according to embodiments of the invention. The mobile telephone and media player of FIGS. 7a and 7b can maintain a smaller, lower cost physical product by utilizing the flex circuit according to embodiments of the invention.

Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

What is claimed is:

1. A method for providing electrical connections to both sides of a touch sensor panel, comprising:
    forming conductive traces on a first surface of a base film;
    shaping the base film to form first and second attachment areas, the first and second attachment areas including the conductive traces;
    forming a conductive shield over the conductive traces, the shield electrically coupled to one or more of the conductive traces; and
    folding the base film such that the conductive traces on the first and second attachment areas are positioned and aligned for attachment to pads on first and second sides of the touch sensor panel.

2. The method of claim 1, further comprising forming an insulator between the conductive shield and the conductive traces.

3. The method of claim 1, further comprising forming active and dummy conductors on the first attachment area and lower conductors on the second attachment area, the lower conductors arranged in conjunction with the active and dummy conductors so that when the flex circuit is folded and attached to the touch sensor panel, the lower conductors and the active and dummy conductors are not on directly opposing sides of the touch sensor panel.

4. The method of claim 1, further comprising integrally forming a tail with the flex circuit, the tail containing tail conductors for connecting to a logic board.

5. The method of claim 1, further comprising:
    forming active and dummy conductors on the first attachment area, with one or more dummy conductors placed between each active conductor; and
    spacing the active and dummy conductors to substantially contain conductive bonding material used to bond the first attachment area to the touch sensor panel.

6. The method of claim 2, further comprising:
    forming lower conductors on the second attachment area;
    limiting the insulator to expose the lower conductors at each distal end of the second attachment area; and
    adding a stiffener at each distal end of the second attachment area, the stiffeners and the exposed lower conductors located on directly opposing sides of the distal ends of the second attachment area.

7. The method of claim 2, wherein forming the conductive shield comprises:
    forming a first conductive film over the insulator; and
    connecting the first conductive film to one or more of the conductive traces for holding the first conductive film at a fixed potential.

8. The method of claim 7, further comprising forming a first opening in the insulator for providing a connection from the first conductive film to the one or more conductive traces.

9. The method of claim 8, further comprising:
    forming a second conductive film on a second surface of the base film; and
    connecting the second conductive film to one or more of the conductive traces for holding the second conductive film at a fixed potential.

10. The method of claim 9, further comprising forming a second opening in the base film and the insulator for providing a connection from the second conductive film to the first conductive film.

11. The method of claim 10, wherein either or both of the first and second openings are notches.

12. The method of claim 8, further comprising:
    forming a bottom conductive film on a bottom side of the flex circuit;
    overhanging the top and bottom conductive films beyond the flex circuit; and
    conductively bonding the top and bottom conductive films in the overhanging area.

* * * * *